United States Patent [19]

Domanski

[11] 4,064,546
[45] Dec. 20, 1977

[54] PROTECTION CIRCUITS

[75] Inventor: Thadée Domanski, Annezin-les-Bethune, France

[73] Assignee: Societe Chimique des Charbonnages, Paris, France

[21] Appl. No.: 696,705

[22] Filed: June 16, 1976

[30] Foreign Application Priority Data

June 23, 1975 France .................................. 75.19591
Mar. 24, 1976 France .................................. 76.08478
May 10, 1976 France .................................. 76.13976

[51] Int. Cl.² ............................................. H02H 3/24
[52] U.S. Cl. ..................................... 361/33; 361/86; 361/92; 340/248 B; 335/151
[58] Field of Search ............ 317/46, 31, 47, 49, 317/155.5, 13 R; 340/248 B, 248 A; 335/151, 183; 361/33, 92, 88, 86

[56] References Cited

U.S. PATENT DOCUMENTS

| | | | |
|---|---|---|---|
| 2,938,150 | 5/1960 | Kniel | 317/46 |
| 3,313,984 | 4/1967 | Hupp | 317/31 X |
| 3,368,129 | 2/1968 | Chausse et al. | 317/46 X |
| 3,416,035 | 12/1968 | Lipnitz | 317/36 TD X |
| 3,465,208 | 9/1969 | Patrickson et al. | 317/155.5 X |
| 3,546,531 | 12/1970 | Miner | 317/46 X |
| 3,636,541 | 1/1972 | Genuit | 340/248 B |
| 3,870,928 | 3/1975 | Allen | 317/31 X |

*Primary Examiner*—J D Miller
*Assistant Examiner*—Patrick R. Salce

[57] ABSTRACT

A protection circuit is provided which incorporates a reed relay whose contacts form the circuit breaker of an electrical appliance. The winding of the reed relay is supplied with a rectified alternating current derived from a current transformer coupled to the supply line to the appliance. In order to avoid periods of zero current in the winding, the winding is also supplied with a rectified alternating current from a source which is out of phase with that supplying the supply line. Failure of the current on the line will cause the contacts to open. Preferably the relay has a set of self latching contacts to prevent re-energization of the winding once de-energized. A manually operable reset switch is provided in series with the self latching contacts.

15 Claims, 7 Drawing Figures

PROTECTION CIRCUITS

BACKGROUND OF THE INVENTION

1. Field of the Invention

The present invention relates to protection circuits for protecting electrical motors for example.

2. Description of the Prior Art

Electrical appliance protection circuits are known which incorporate reed relays as well as other relays havng contact sets which operate in response to direct currents applied to the winding of the relay and act as a circuit breaker for the appliance. Such relays cannot operate satisfactorily if supplied with an alternating current even when the alternating current is first rectified since the contacts will tend to open each time the current drops to zero level at the end of every half cycle. This results in vibrations which will reduce the service life of the circuit breakers. It is an object of the invention to provide an improved protection circuit for an electrical appliance.

It is a more particular object to provide a protection circuit for the protection of three-phase motors by detecting a possible phase interruption or an open-circuit condition of the motor, and then operating a circuit breaker to disconnect the motor from the supply.

SUMMARY OF THE INVENTION

According to the invention there is provided a protection circuit for protecting an electric appliance supplied through a power supply line, comprising a reed switch having a set of magnetizable contact members, a set of contacts each contact being mounted on a respective one of the contact members, a capsule housing the contact members and the set of contacts and winding means supported by the capsule and energizable to produce a magnetic field for causing relative movement of the two contact members between first and second relative positioned settings, generating means coupled to the power supply line to generate a current in response to the current drawn by the appliance through the power supply line, first rectifying means electrically connected to the generating means for rectifying the generated current and supplying the rectified current to energise the winding means, means supplying a current out-of-phase with the current generated by the generating means, and second rectifying means connected to the current supply means to rectify the out-of-phase current and supplying the current to the winding means in a sense to produce a magnetic field assisting that produced by the generating means, whereby the composite magnetic field generated will maintain the set of contacts in the said first setting while the supply of both currents to the winding means is sustained but will switch the contacts to the second setting when the supply of one of said currents to the winding means fails.

According to the invention there is further provided a protection circuit for protecting an electrical appliance connected to a polyphase supply, comprising means coupled to each phase of the polyphase supply to generate currents corresponding to the currents drawn by each phase of the polyphase supply, rectifying means connected to each generating means rectifying the current generated thereby, and a reed relay having a set of contacts connected as a circuit breaker for the appliance, and winding means connected to the rectifying means to receive the rectified currents, the rectified currents supplied to the winding means all assisting in the generation of a magnetic field to close the set of contacts whereby in the event of current failure in one or more phases of the supply the magnetic field will drop sufficiently to allow the contacts to open and so break the circuit of the appliance.

According to the invention there is still further provided a protection circuit for protecting an electrical appliance connected to a polyphase supply in the event of a current failure in one or more phases of the polyphase supply, the circuit comprising a relay switch having energizing winding means and a set of contacts connectable as a circuit breaker for the appliance and actuatable in response to energisation of the winding means, current transformer means coupled to each phase of the supply for detecting the presence of a current in each phase of the said supply, rectifying means connected to each current transformer means for rectifying the output of the current transformer means, and means feeding the currents from the rectifying means to the winding means in a sense to assist each other in producing a magnetic field for actuating the set of contacts, whereby the failure of current in at least one of the phases of the supply will cause at least a partial current failure in the winding means and therefore deactuation of the contacts.

According to the invention there is yet further provided a method for detecting an alternating current, comprising the steps of using the current to generate an a.c. signal, rectifying the a.c. signal, supplying the rectified signal to energise winding means of a reed switch having a set of contacts carried by a pair of magnetisable blades housed in a capsule, rectifying the current from a source providing a current out of phase with the a.c. signal, and supplying the current to the winding means of the reed switch in such a sense as to assist the field generated by the rectified a.c. signal, the energisation of the winding means by the rectified a.c. signal and the rectified out-of-phase current maintaining the set of contacts closed and thus indicating the presence of the alternating current to be detected.

BRIEF DESCRIPTION OF THE DRAWINGS

Electric motor protection circuits embodying the invention will now be described by way of example with reference to the accompanying diagrammatic drawings, in which.

DESCRIPTION OF THE PREFERRED EMBODIMENTS

Figure 1:
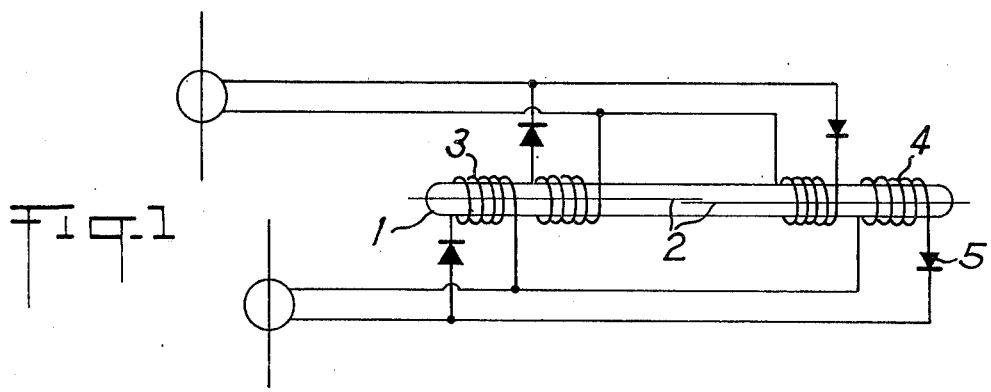
FIG. 1 is a circuit diagram of a single phase motor protection circuit embodying the invention.

The electric motor protection circuit shown in FIG. 1 includes a reed switch connected in circuit with an electric motor (not shown) to be protected. The reed switch includes a capsule 1 enclosing a pair of switch contacts 2 in the form of two flexible magnetisable blades. The capsule carries a winding which is divided into two half-coils 3 and 4. A diode 5 is connected in series with each half-coil so that when the winding is energised with an a.c. current derived from a current transformer coupled to the supply line for supplying the motor, only the positive half cycles are fed through one half coil and only the negative half cycles are fed through the other half coil. The two half coils are wound about the capsule in a sense, such the magnetic field that each half coil generates upon energisation is in the same predetermined direction along the axis of the reed switch. To prevent relay chatter which occurs as a result of the magnetic field dropping to zero during each half cycle, a second winding similar to the first winding is wound on the capsule. The second winding is divided into two half coils and each half coil is connected to the output of a second current transformer through a corresponding diode. The second current transformer is coupled to a second supply line carrying a current which is out of phase with the current of the first mentioned supply line.

Thus, when the magnetic field generated by the first winding falls to zero at the end of each half cycle the magnetic field generated by the second winding, which is out of phase with that provided by th first winding, acts to maintain the switch contacts 2 closed. Thus, if the current in one of the windings fails, the magnetic field along the axis of the reed switch will fall to zero every half cycle, thus causing the opening of the contacts 2. To obtain a positive opening action, it is preferable to group the half-coils of the two windings at opposite ends of the capsule.

Figure 2:
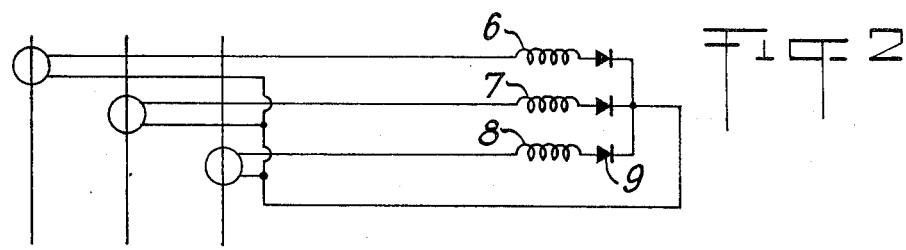
FIGS. 2 to 7 are circuit diagrams of three phase motor protection circuits embodying the invention.

The three-phase protection current shown in FIG. 2 is intended to detect a current failure in any one of the three phases of a three phase supply. The reed switch of FIG. 2 has a capsule (not shown) which is surrounded by three coils 6, 7 and 8. Each coil is supplied with current from a corresponding one of three current transformers coupled to respective ones of three supply lines of the three phase supply as shown. The current supplied by each current transformer to its correspnding coil is rectified by a diode 9. The windings are so coupled that when energised they all produce a magnetic field in the same predetermined direction along the axis of the switch. It will be appreciated that the resultant magnetic flux along the axis of the switch will never fall to zero unless the current in one or more of the supply lines fails.

Figure 3:
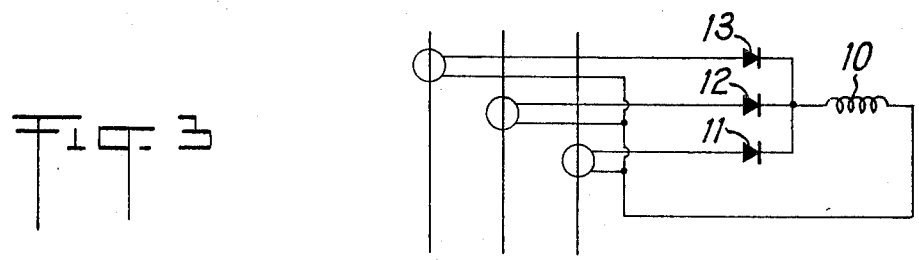

In the three phase protection circuit shown in FIG. 3 three diodes 11 to 13 are star connected and supplied with current from three current transformers coupled into the three lines of a three phase supply. The winding 10 of a reed switch is coupled between the star or neutral point of the star connection and the return lines of the three current transformers. The rectified current flowing through the winding 10 will not fall to zero unless the current in one of the supply lines fails. Consequently the reed switch is only opened when the current in one or more phases of the supply fails.

Figure 4:
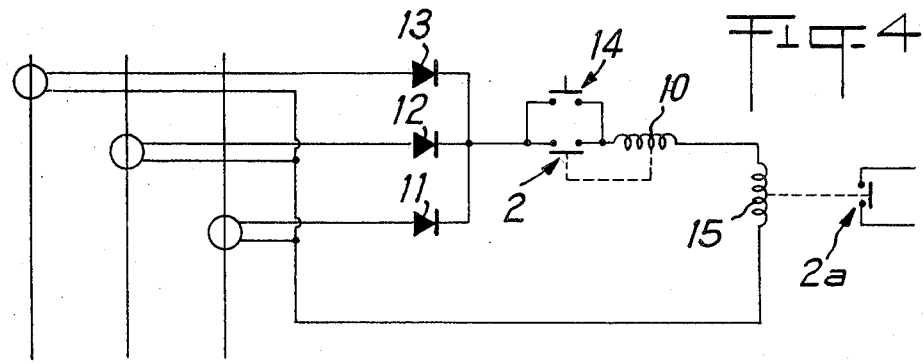

In the three phase protection circuit of FIG. 4 parts similar to those in FIG. 3 are similarly referenced. In the circuit of FIG. 4, the switch contacts of the reed switch incorporating the winding 10 are connected in series with the winding 10 and a winding 15 of another reed switch, and the series combination is connected between the star point of the star connected diodes 11 to 13 and the return paths of the current transformers. The reed switch incorporating the winding 15 has a pair of contacts 2a connected in circuit with a motor (not shown) to be protected. A reset or starting switch 14 is connected in parallel with the contacts 2. In operation, when the winding 10 of the reed switch is de-energized the contacts 2 are open and no current will flow. By first operating the start switch 14 the winding 10 is energized and the switch contacts 2 are closed. Release of the start switch 14 will have no effect. When the winding 10 is energized, the winding 15 will also be energized and the switch contacts 2a closed. When the current in one phase fails, both sets of contacts 2 and 2a will open and energization cannot recommence until the start switch 14 is operated again.

Figure 5:
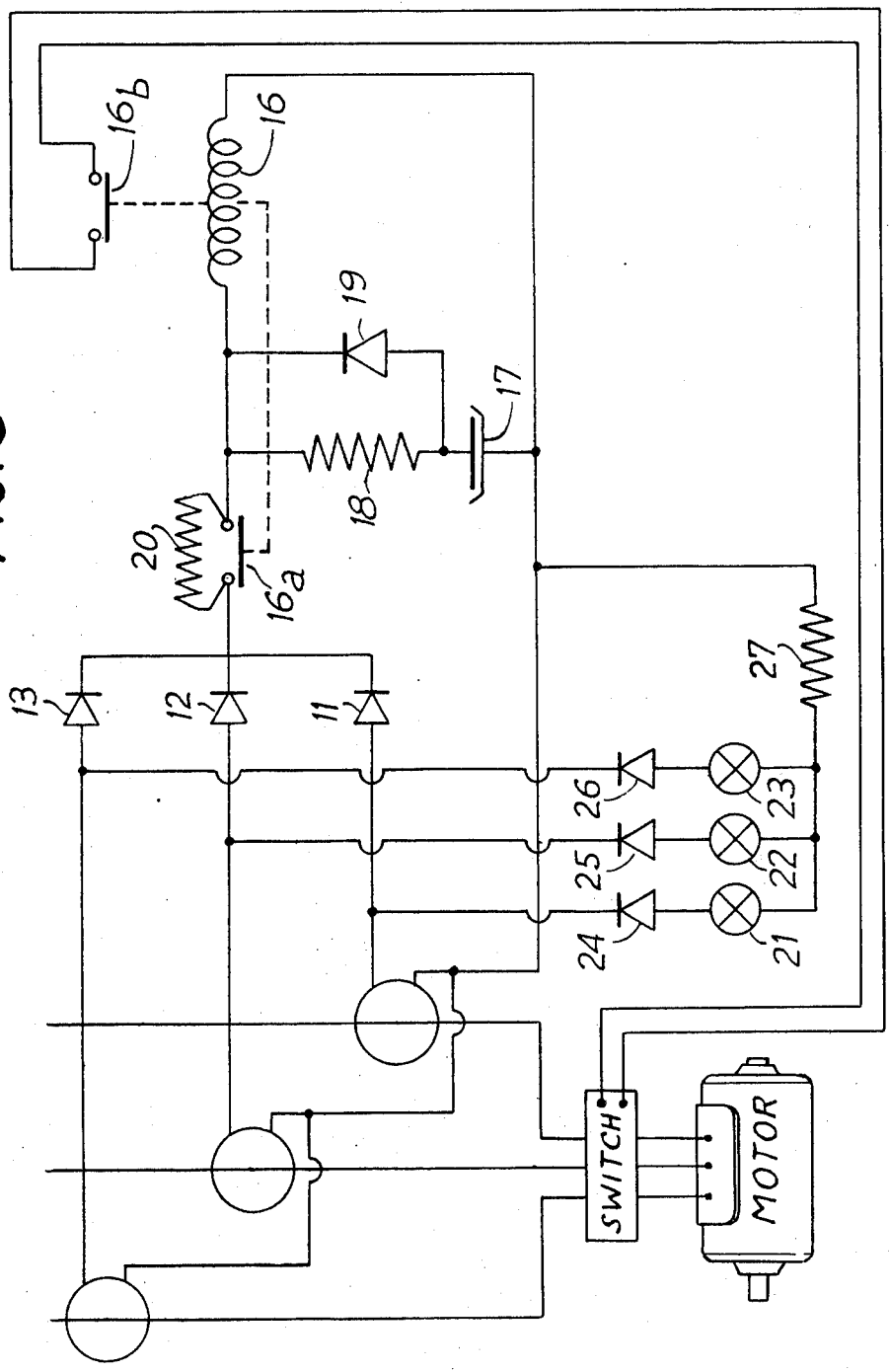

In the three phase protection circuit shown in FIG. 5, parts similar to those shown in FIG. 4 are similarly referenced. In FIG. 5 instead of providing two reed switches each having separate windings as in FIG. 4, a single winding 16 is provided which is common to two reed switch capsules each containing a respective set of contacts 16a and 16b.

The contacts 16a are connected in series with the winding 16 while the contacts 16b are connected in circuit with the motor to be protected. The winding 16 is shunted by the series combination of a capacitor 17 and resistor 18. A diode 19 is connected in parallel with the resistor 18 and a resistor 20 is connected in parallel with the contacts 16a.

In operation, when the winding 16 is energized the contacts 16a and 16b are closed. The capacitor is charged through the resistor 18. If now there is a transient discontinuity in the current supply in one of the supply lines the current supply through the contacts 16a will be temporarily interrupted. The capacitor 17 will however now discharge through the diode 19 to maintain the winding energized and so keep the contacts 16a and 16b closed. If however the current discontinuity persists and the capacitor 17 is allowed to discharge completely, the winding 16 will become de-energized.

The purpose of the resistor 20 is to provide the winding 16 with an energizing current only when the current in the supply line exceeds a nominal level in response to a high starting current being drawn by the motor. The resistor 20, however, has a sufficiently high value so as not to supply the winding with sufficient current to maintain energization of the winding when the motor draws a normal current from the power supply.

Three light emitting diodes (LED's) 21, 22 and 23 are connected in star configuration, and the star configuration of LED's is connected in parallel with the star configuration of diodes 11 to 13. Each light emitting diode 21, 22 and 23 is protected against reverse currents by a corresponding one of three diodes 24 to 26. The star point of the LED star configuration is connected to the return paths of the current transformers through a limiting resistor 27. In operation when all three phases of the supply are passing current, the three current transformers supply the three LED's 21 to 23 with current and therefore all three LED's emit light. As soon as there is a current failure in one of the supply phases, the LED corresponding to that phase is quenched thus indicating the failure.

In a modification when the protection circuit is required to protect a motor from overvoltages the current transformers are so designed as to be saturated when the phase voltages exceed the normal operating voltage. In this way as soon as an overvoltage occurs in one or more phases the output currents from the current transformers associated with those phases will fall to zero to deenergize the reed switch. However, if the overvoltages are only of short duration the discharge from the capacitor 17 will maintain the winding 16 energized until the line voltages return to normal.

Care must be taken to ensure that relative phases of the output currents provided by the three current transformers are equiangularly spaced to avoid a period during which the current fed to the winding 16 falls to zero resulting in the opening of the switch contacts 16a and 16b.

In another modification the capacitor 17 can be replaced with rechargeable battery having an appropriate output voltage.

The shunt resistor 20 is so designed that subtransient currents produced in the supply lines by incompletely stopped motors and heating appliances are too weak to actuate the relay 16 via the shunt resistor 20.

Figure 6:
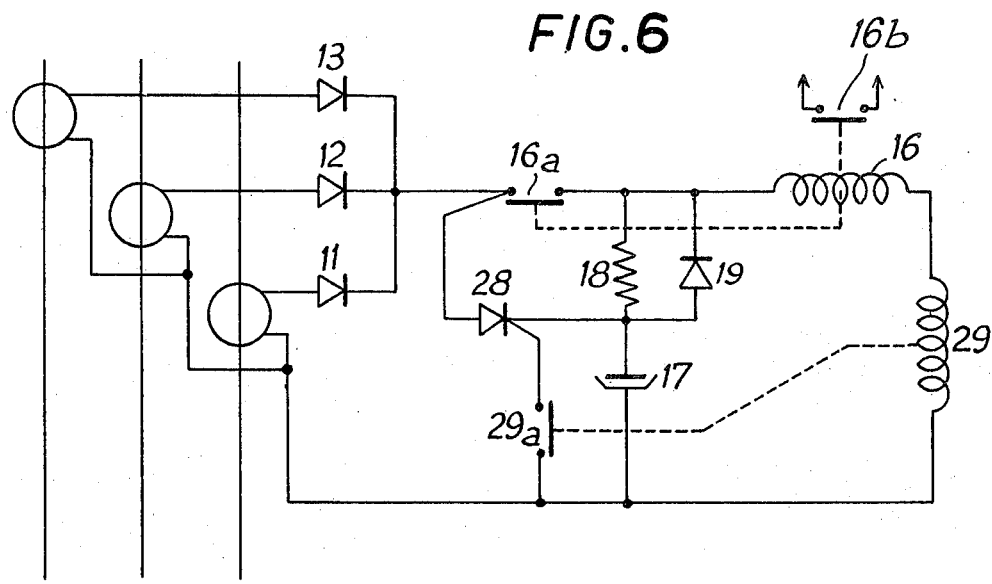

In the protection circuit shown in FIG. 6 parts similar to those in FIG. 5 are similarly references. As shown in FIG. 6, a thyristor 28 is connected in parallel with the series combination of the contacts 16a and the resistor 18. The control electrode of the thyristor is connected to the return path for the current transformers via the contacts 29a of an auxiliary relay. The auxiliary relay has an energizing winding 29 connected in series with the winding 16.

In operation, when the winding 16 is de-energized and the current transformers detect the flow of current in the main supply lines, a voltage difference will appear across the switch contacts 16a. This voltage is sensed by the thyristor 28 which thereupon becomes conductive. Energizing current is accordingly supplied to the winding 16 whereupon the contact sets 16a and 16b both close. The contact set 16a thereupon takes over the function of maintaining the winding 16 energized. By this time the capacitor 17 will have been charged through the thyristor 28 thus preventing any danger of accidental release. As soon as the contacts 16a have closed, the winding 29 is energized and closes its contacts 29a. A negative pulse is thereupon fed to the control electrode of the thyristor 28 which immediately ceases to conduct. The thyristor 28 will remain blocked until the winding 29 is deenergized and the winding 29 will remain energized until the contacts 16a open.

Figure 7:
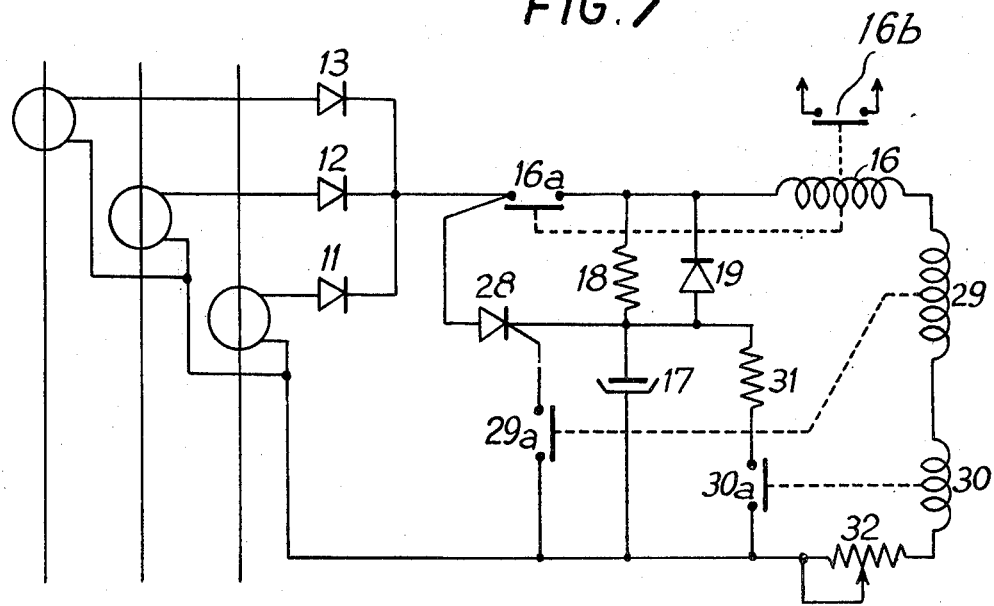

In the protection circuit shown in FIG. 7 parts similar to those in FIG. 6 are similarly referenced. In FIG. 7 the energizing winding 30 of a further relay and a variable resistor 32 are connected in series with the energizing windings 16 and 29. The series combination of a resistor 31 and the contacts 30a associated with the energizing winding 30 are connected between the return path for the current transformers and the junction between the capacitor 17 and resistor 18. The winding 30 is responsive to close the contact set 30a only when the current drawn by the supply lines exceeds the nominal value such as when the motor supplied by the supply line is started. This causes the capacitor 17 to be discharged through the resistor 31 during the motor starting period, a feature which is highly desirable in the case of slow starting motors. The variable resistor 32 is provided to restrict the current drawn by the energizing windings. The value of this resistor 32 is set so that when the energizing current supplied to the windings drops below a minimum value corresponding to an open-circuit condition of the motor, drawing little or no current from the supply lines, the contact set 16a opens.

It will be appreciated that it is possible for the contacts 29a and 30a to be controlled by the coil 16 by appropriately positioning their respective capsules with respect to the coil 16, accurate positioning rendering it possible to obtain the sensitively required for each contactor.

I claim:

1. A protection circuit for protecting an electric appliance supplied through a power supply line, comprising
a reed switch having a set of magnetizable contact members, a set of contacts, each contact being mounted on a respective one of the contact members, a capsule housing the contact members and the set of contacts, and winding means supported by the capsule and energizable to produce a magnetic field for causing relative movement of the two contact members between first and second relative positioned settings,
generating means coupled to the power supply line to generate a current in response to the current drawn by the appliance through the power supply line,
first rectifying means electrically connected to the generating means for rectifying the generated current and supplying the rectified current to energize the winding means,
means supplying a current out-of-phase with the current generated by the generating means, and
second rectifying means connected to the current supply means to rectify the out-of-phase current and supplying the current to the winding means in a sense to produce a magnetic field assisting that produced by the generating means, whereby the composite magnetic field generated will maintain the set of contacts in the said first setting while the supply of both currents to the winding means is sustained but will switch the contacts to the second setting when the supply of one of said currents to the winding means fails.

2. A circuit according to claim 1, wherein the winding means comprises a first winding having two coils, and the first rectifying means comprises two diodes, one diode being connected to one said coil to supply alternate half cycles of the current from the generating means to the said one coil, and the other diode being connected to the other said coil to supply the other coil with intervening half cycles.

3. A circuit according to claim 2, wherein the power supply line comprises one phase of a polyphase supply and the means supplying the out-of-phase current comprises second generating means coupled to another phase of the polyphase supply.

4. A protection circuit for protecting an electrical appliance connected to a polyphase supply, comprising:
means coupled to each phase of the polyphase supply to generate currents corresponding to the currents drawn by each phase of the polyphase supply,
rectifying means connected to each generating means rectifying the current generated thereby, and
a reed relay having a set of contacts connected as a circuit breaker for the appliance, and
winding means connected to the rectifying means to receive the rectified currents, the rectified currents supplied to the winding means all assisting in the generation of a magnectic field to close the set of contacts whereby in the event of current failure in one or more phases of the supply, the magnetic field will drop sufficiently to allow the contacts to open and so break the circuit of the appliance, and
wherein the winding means comprises one coil for each phase of the polyphase supply, each coil being connected to receive the current from a corresponding said rectifying means, and wherein the rectifying means comprises a diode connected in a series with each coil.

5. A circuit according to claim 4, wherein the coils are interconnected in star configuration.

6. A circuit according to claim 5, including
a light emitting diode for each phase of the polyphase supply, and means connecting the diodes in star configuration and connecting the diode star configuration to receive the rectified current generated for each phase, whereby the failure of a diode to light is indicative of the current failure in a corresponding phase of the polyphase supply.

7. A circuit according to claim 4, wherein the winding means comprises a single coil connected to receive the sum of the rectified currents.

8. A circuit according to claim 4, including a variable resistor connected in series with the winding means to vary the level of current drawn by the winding means.

9. A protection circuit for protecting an electrical appliance connected to a polyphase supply in the event of a current failure in one or more phases of the polyphase supply, the circuit comprising:

a relay switch having energizing winding means and a set of contacts connectable as a circuit breaker for the appliance and actuable in response to energization of the winding means, current transformer means coupled to each phase of the supply for detecting the presence of a current in each phase of the said supply, rectifying means connected to each current transformer means for rectifying the output of the current transformer means, and means feeding the currents from the rectifying means to the winding means in a sense to assist each other in producing a magnetic field for actuating the set of contacts, whereby the failure of current in at least one of the phases of the supply will cause at least a partial current failure in the winding means and therefore de-actuation of the contacts, and wherein the relay switch includes a second set of contacts connected by the feeding means in series with the winding means and the rectifying means, the second set of contacts constituting a self-latching set of contacts for the relay switch, whereby failure of current in at least one of the phases of the supply will interrupt the current path between the rectifying means and the winding means.

10. A circuit according to claim 9, including a resistor is connected in parallel with the second set of contacts.

11. A circuit according to claim 9, including a reset switch connected in parallel with the second set of contacts and operable to temporarily short-circuit the said second set of contacts in order to enable re-energization of the winding means.

12. A circuit according to claim 11, including a thyristor having a control electrode and an anode-cathode path, the anode-cathode path being connected in shunt with the said second set of contacts, a third set of relay contacts included in the relay switch means connecting the control electrode in series with the third set of contacts and connecting the winding means in series with the anode cathode path of the thyristor whereby when the winding means are de-energized the third set of contacts are open and the thyristor is capable of conducting currents from the rectifying means in a sense to cause energization of the winding means, whereafter, in response to energization of the winding means the third set of contacts are closed and the thyristor rendered non-conductive.

13. A circuit according to claim 9, including a charge/discharge circuit, and means connecting the charge/discharge circuit in parallel with the winding means, the charge/discharge circuit being chargeable when the winding means is energized and dischargeable through the winding means in the absence of any other energizing current, whereby to maintain the winding means energized during temporary discontinuities in the currents of the power supply and thus render the protection circuit substantially insensitive to transients in the power supply.

14. A circuit according to claim 13, whereby the charge/discharge circuit comprises a resistor, a capacitor, a diode, and means connecting resistor and capacitor in series across the winding means and connecting the diode in parallel with the resistor in such a sense that the charging of the capacitor takes place through the resistor but the discharging of the capacitor takes place through the diode.

15. A circuit according to claim 14, wherein the relay means includes a fourth set of contacts controlled by the winding means, and means connecting the fourth set of contacts in shunt with the capacitor to provide a discharge path for the capacitor, the set of contacts being closed in response to the current supplied to the winding means exceeding a predetermined level, thereby to prevent the capacitor charging while the current exceeds the predetermined level.

* * * * *